United States Patent [19]

Callahan

[11] 4,306,114
[45] Dec. 15, 1981

[54] AUTOMATIC AUDIO MIXING SELECTOR DEVICE

[75] Inventor: Jeffery C. Callahan, Tulsa, Okla.

[73] Assignee: Summa-Nova Corporation, Tulsa, Okla.

[21] Appl. No.: 113,656

[22] Filed: Jan. 21, 1980

[51] Int. Cl.³ ............................................. G09B 5/04
[52] U.S. Cl. ................................ 179/1 B; 179/1 SW; 369/3; 369/5
[58] Field of Search ........... 179/1 B, 1 SW, 100.1 PS; 340/147 SC; 371/8, 9; 455/8, 52, 133, 135

[56] References Cited
U.S. PATENT DOCUMENTS

| | | | |
|---|---|---|---|
| 3,809,810 | 5/1974 | Walker et al. | 179/100.1 PS |
| 3,809,812 | 5/1974 | Smith, Sr. | 179/1 SW |
| 3,952,154 | 4/1976 | Gates, Jr. | 179/1 SW |
| 3,956,591 | 5/1976 | Gates, Jr. | 179/1 SW |

Primary Examiner—Joseph A. Popek
Attorney, Agent, or Firm—James H. Chafin

[57] ABSTRACT

An automatic mixing selector device for use with an audio amplifier or tuner for automatic priority selection and digital fading of two or more audio sources using the amplifier and tuner controls. The circuit comprises a priority selector circuit which monitors the designated priority audio source for signal amplitude and duration, a micro-computer then operates a digital fader to phase in the priority signal and also to phase in the alternate signal in the absence of a sufficient priority signal.

11 Claims, 12 Drawing Figures

AUTOMATIC AUDIO MIXING SELECTOR DEVICE

BACKGROUND OF THE INVENTION

1. Field of the Invention

The present invention relates to automatic audio detecting switching devices and more particularly, but not by way of limitation, to a mixing selector circuit having a micro-computer for the automatic fading and switching of a plurality of audio signals. The automatic switching selector device may be built into the amplifier and/or tuner or may be constructed as a black box which is connectable to the input and output jacks of existing sound systems.

2. History of the Prior Art

A typical home entertainment system comprises a tape deck, record player, AM/FM stereo tuner and amplifier and speakers. Often at parties or social events it is desirable to have background music which may consist of an FM radio station or records or both.

The constant monitoring of a record changer can become a nuisance to the host in changing records and turning on the FM station when the records are finished playing.

This problem not only exists in entertainment systems but also at commercial radio stations where it was desired to monitor a priority signal source.

If a disc jockey is away from his station when a record finishes playing, it would be desirable to automatically fade in or switch in an alternate signal source.

Several attempts have been made to solve this problem by rather elaborate programming devices such as taught in the patent to Smith, Sr., U.S. Pat. No. 3,809,812, issued in 1974 for a "Programming System". While such a device might be feasible for an unmanned FM station, it would be prohibitively expensive and complicated for home use.

A more pertinent solution to the problem was provided by two patents to Gates, U.S. Pat. No. 3,952,154, issued in 1976 for "Automatic Audio Source Selector For Stereo Entertainment Centers" and the subsequent patent, U.S. Pat. No. 3,956,591, issued in 1976 for "Two-Input Automatic Source Selector For Stereo Entertainment Centers".

While the two patents to Gates solved the basic problem set out above, the selection of audio in the Gates patents is by switching abruptly from one source to another when sound has been detected on the priority source. This solution to the problem could be more disconcerting than the problem itself and would give rise to switching back and forth during the pause between songs on a single record. Further, if a record or tape is the priority source, and switching is not made until the source is already playing, often the first notes of the musical composition are clipped and one does not hear the full record.

SUMMARY OF THE INVENTION

The present invention provides a solution to the problems hereinbefore set forth in a rather simple but sophisticated circuit including a micro-computer which analyzes the audio signals being monitored to determine if there is a priority signal present, the strength of the signal and whether or not the signal duration is sufficient to warrant fading out the alternate signal and fading in the priority signal. If the priority signal is a record player, the detection device monitors whether or not the needle is still in the groove when a song has finished in order to fade back to the alternate audio signal.

Since the present invention detects when the needle enters a groove or when there is tape noise on a tape player of a priority source, the alternate music source is immediately faded out and then a determination is made as to whether or not there is music present on the priority source. If there is music present, the priority source is faded in rather than switched in abruptly. On the other hand, if the record player needle is still on the lead-in groove, the priority signal is switched in so that the first note is not missed thereby providing a minimum of interference with the priority audio source.

As an example, consider the tuner as an alternate audio signal and a record as the priority audio signal. The tuner is coupled with the mixer which in turn is connected to the tuner input jack at the amplifier. The record player is connected to the phono input jacks while the mixer is connected to one set of the tape monitor jacks. Other audio sources such as tape decks may be connected to the input of the other tape monitor jacks.

The tape monitor switch is then set to route the record player output of the mixer through the tape monitor jacks. Hence, the mixer receives its alternate audio signal from the tuner as input A and the priority audio signal from the phono through the tape jack as input B. The mixer is also connected to a switchable power outlet on the back of the amplifier so that the mixer is powered up with the amplifier.

If there is no signal present at input A, the tuner signal is routed directly through an audio signal selector circuit and through output buffers to the tuner input jacks for broadcast by the stereo system speaker.

When a record is played, as soon as the tone arm stylus makes contact with the record surface, an audio signal appears at input A which is fed through a mixer circuit to form a composite signal at both left and right channels which is in turn fed through a Schmitt triggering circuit which passes the signal to a micro-computer. The computer, through digital comparison with programmed amplitude levels and time lapses, determines that there is a priority signal present at input A and immediately activates the audio selector circuit and a plurality of digital faders to fade out the tuner signal. At this point the input at A is again checked to see whether or not there is music present. If there is music present, the priority signal at input A is faded in. On the other hand, if the needle is still in the groove rather than music playing, the priority signal is switched in so that the first note is picked up on the record.

After the needle has lifted off the record surface, the computer will switch out the signal from input A and fade in the tuner signal at input B so that there is a smooth transition from one source to the other.

A different priority signal may be selected such as a tape player or the like, by using the tape monitor selector switch located on the amplifier. The only replugging of the input and output jacks that is necessary is if the user wishes to select some source other than the tuner as the alternate audio source.

DESCRIPTION OF THE DRAWINGS

Other and further advantageous features of the present invention will hereinafter more fully appear in connection with a detailed description of the drawings in which:

FIGS. 3, 4 and 5 depict the entire circuit of the automatic mixer device with the connection lines between FIGS. 3, 4 and 5 being depicted by capital letters A through L.

DESCRIPTION OF THE PREFERRED EMBODIMENTS

Figure 2:
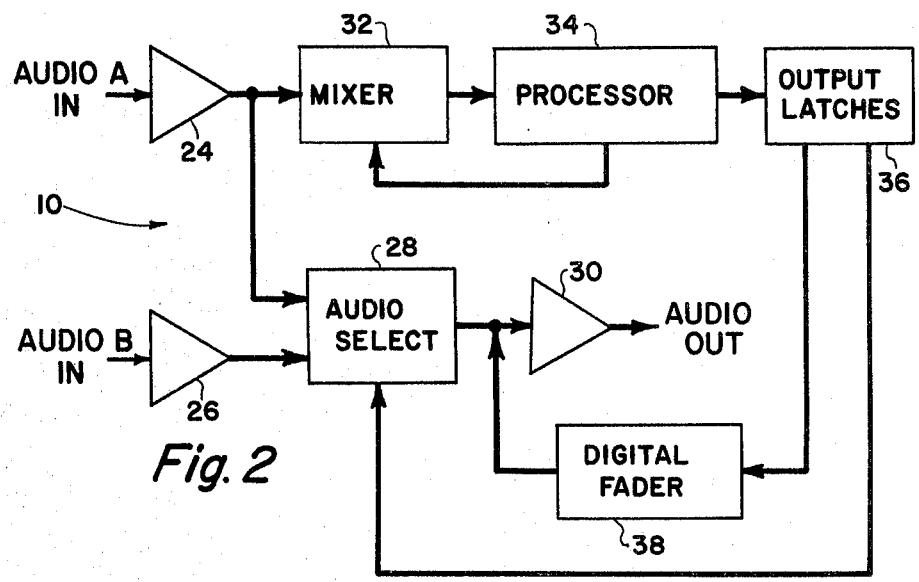
FIG. 2 is a system schematic block diagram of a mixer circuit embodying the present invention.

Referring to the drawings in detail, reference character 10, shown in FIG. 1, generally indicates an automatic audio mixer selector hereinafter referred to as mixer which is operational with or may be made as an integral part of an amplifier 12 for use in priority selection of audio signal sources from apparatuses such as a record player 14, tuner 16 and tape recorder 18. When adapted for use with stereo systems, the mixer 10 comprises a first pair of input jacks J1 and J2 which are operably connected to the output jacks of a first set of tape jacks T1 normally located on the back of the amplifier 12.

Figure 1:
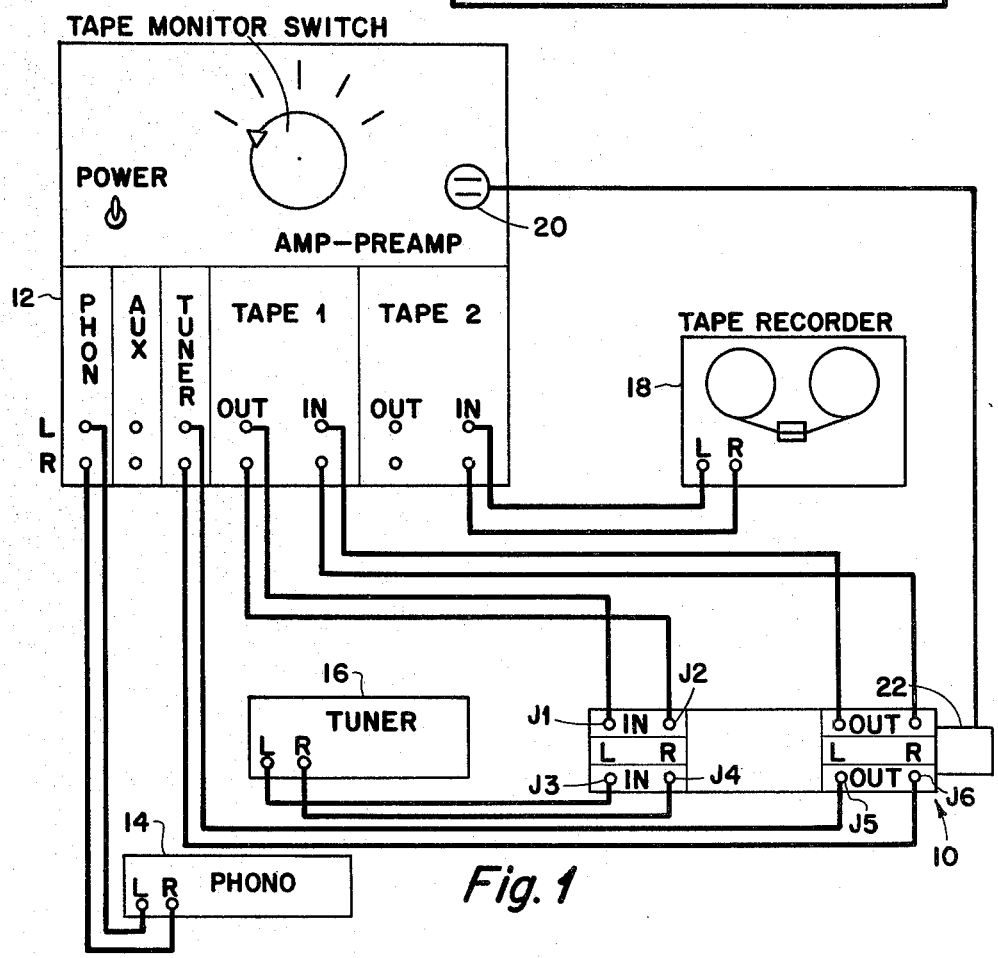
FIG. 1 depicts an amplifier, a plurality of audio sources and an automatic mixer circuit embodying the present invention connected in schematic form.

The mixer 10 further comprises a second pair of input jacks J3 and J4 which are connected to what will be referred to as an alternate audio source shown as the tuner 16 in FIG. 1.

The mixer 10 further comprises a pair of output jacks J5 and J6 which in this case are operably connected to the tuner input jacks on the amplifier 12. The mixer 10 receives its electrical power from power outlet 20 located on the amplifier 12, through a power supply 22 which in turn supplies DC power at the necessary voltage levels for operating the circuit components hereinafter set forth. For this particular circuit three power output levels are required consisting of a first positive level V1, a negative level V2 and a second positive level V3.

The mixer 10, shown in FIG. 2, generally comprises a pair of stereo input buffers 24 and 26 referred to as audio A input and audio B input, respectively.

The audio outputs of buffers 24 and 26 are provided to an audio selector switching mechanism 28, the output of which is passed through an output buffer 30 and back to the amplifier 12. The output of the stereo input buffer 24 is also applied to the input of a mixer detector circuit 32 which is in turn operably connected to a micro-computer processor chip 34. The output of the computer process chip 34 is applied back to the mixer 32 and is also provided to an output latching circuit 36. The latching circuit 36 is then operably connected to the audio selector 28 and to the output buffer 30 through a digital fader network 38.

Figure 3:
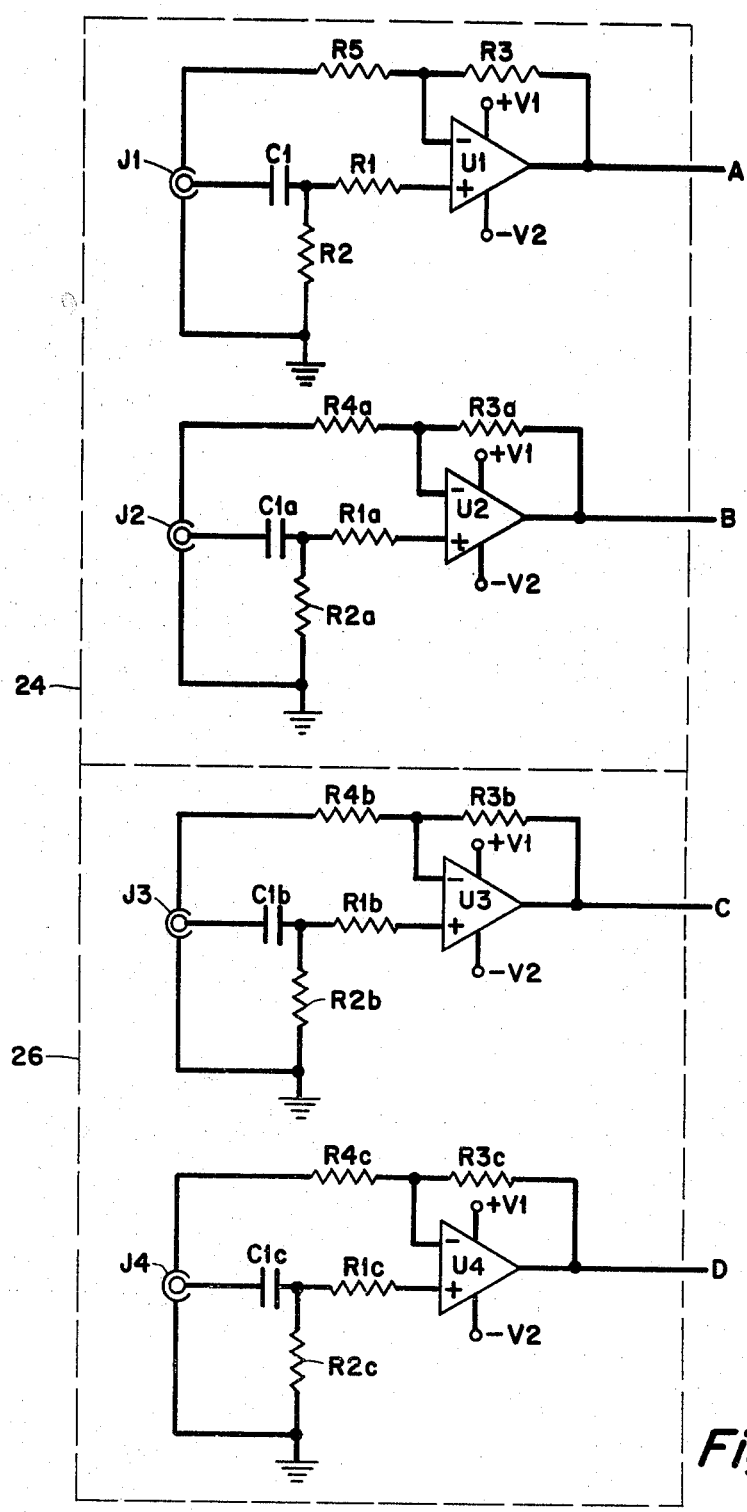
FIG. 3 is a circuit schematic of the input buffers of the mixer of FIG. 2.

Referring to FIG. 3 of the drawings, the input buffers 24 and 26 which receive their inputs via jacks J1, J2, J3 and J4 provide the functions of signal and impedance matching, isolation of DC offset voltages and increasing the dynamic range of the audio signal.

The input buffers 24 and 26 generally comprise operational amplifiers U1, U2, U3 and U4 which receive their audio input signal from the input jacks J1, J2, J3 and J4, respectively.

A signal entering the jack J1 passes through the capacitor C1 which blocks any offset voltages and through the resistor R1 to the positive input of the operational amplifier U1, the capacitor C1 and resistor R1 forming a high pass filter to prevent low frequency noise from entering the mixer, while the resistor R2 provides an audio signal load to ground. The output of the operational amplifier U1 is fed back to the negative input thereof through the resistor R3, the resistors R3 and R4 serving as a voltage divider to control the gain of the amplifier U1.

The buffers comprising operational amplifier U2, U3 and U4 are similarly constructed for a similar function, the components thereof being designated with subscripts a, b and c, respectively.

Figure 5:
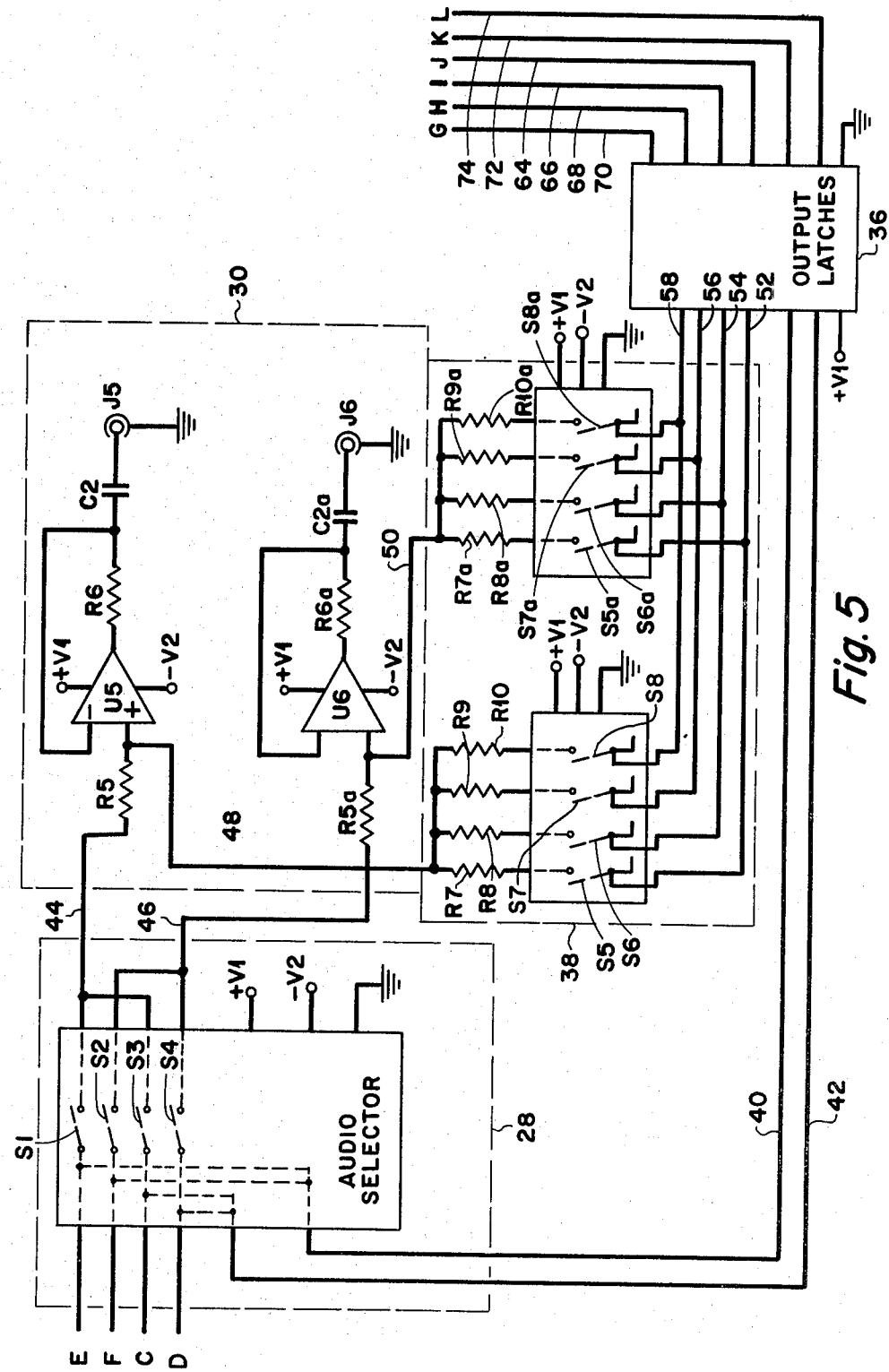
FIG. 5 is a circuit schematic of the audio selector, fader circuits, output buffers and output latches of the mixer of FIG. 2.
Figure 6:
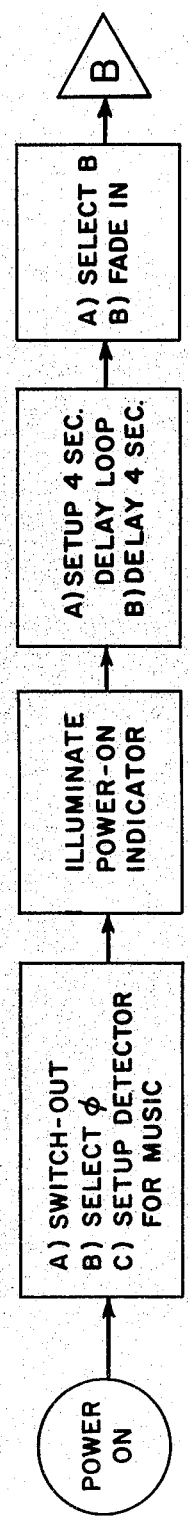
FIGS. 6 through 10 depict a program flow for the micro-computer used in the circuit.
Figure 7:
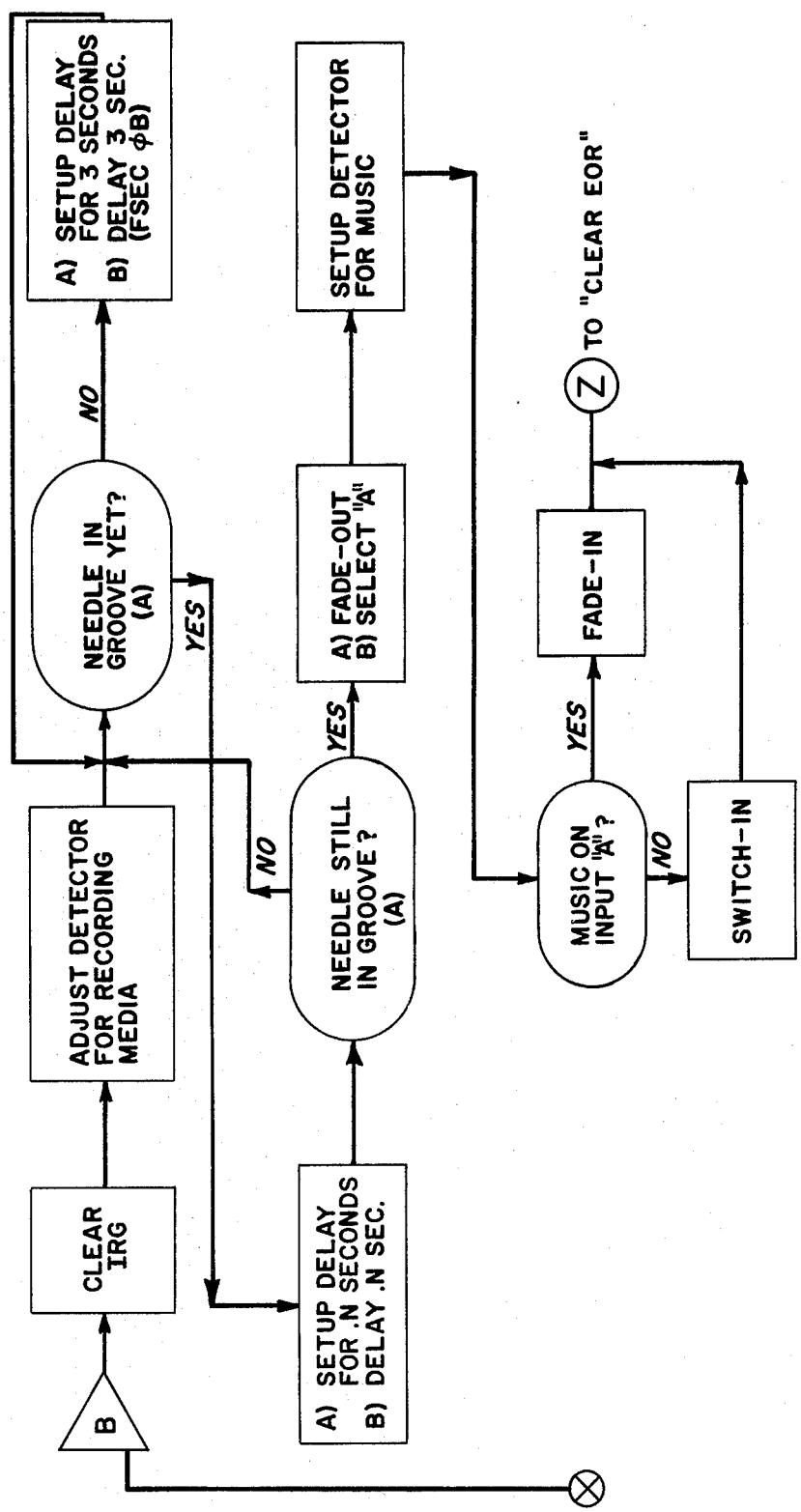

The outputs of the audio amplifiers U1, U2, U3 and U4 designated as A, B, C and D of FIG. 3 are operably connected to the inputs of the audio signal selector 28. The audio selector 28 comprises four analog switches S1, S2, S3 and S4, each being operably connected to the outputs of operational amplifiers U1, U2, U3 and U4, respectively. Switches S1 and S2 are wired for simultaneous operation by a signal from the output latches circuit 36 via line 40 while switches S3 and S4 are simultaneously operated by an output signal from the output latches circuit 36 via line 42 as shown in FIG. 5 of the drawings. The output of switches S1 and S3 are coupled and provided as a first input to the output buffer circuit 30 via line 44 while the output of switches S2 and S4 are coupled and provided as a second input to the output buffer 30 via line 46.

Hence, if switches S1 and S2 are closed, output signals from the input buffer 24 are passed directly to the output buffer 30. On the other hand, if switches S3 and S4 are closed, the outputs from input buffer 26 are passed directly to the output buffer 30.

The output buffer 30 generally comprises a pair of operational amplifiers U5 and U6. The audio signal from line 44 enters the positive input of the operational amplifier U5 through a current limiting resistor R5. The positive input to operational amplifier U5 is also operably connected to one output of the digital fader circuit 38 for a purpose that will be hereinafter set forth. The output of the operational amplifier U5 passes through an impedance matching resistor R6 the output of which is provided as a negative input feedback to the operational amplifier U5.

The output of the resistor R6 is then passed through a capacitor C2 which serves to block any DC offset voltages and in conjunction with the resistor R6 forms a high pass filter. This output is then provided to an output jack J5 as shown in FIG. 5. The operational amplifier U6 receives its input via line 46 and operates in essentially the same manner as that hereinbefore described, the output thereof being provided to an output jack J6. The components associated with the operational amplifier U6 are designated with subscripts a. As hereinbefore set forth, the positive input to the operational amplifier U5 is operably connected to one output of the digital fader circuit 38 via line 48 while the input to operational amplifier U6 is operably connected to a second output of the digital fader 38 via line 50.

The digital fader circuit 38 comprises a first set of analog switches S5, S6, S7 and S8, one side of which are connected to parallel load resistors R7, R8, R9 and R10, the said resistors being coupled together and operably connected to the output line 48 which is in turn connected to the input of operational amplifier U5. The switches S5, S6, S7 and S8 may be simultaneously or sequentially operated by output signals from lines 52, 54, 56 and 58, respectively, from the output latching circuit 36.

The digital fader comprises a second set of identical switches S5a, S6a, S7a and S8a, the operators of which are also connected to lines 52, 54, 56 and 58, respectively, one side of said switches being connected to parallel resistors R7a, R8a, R9a and R10a, respectively. The said resistors are coupled together and attached to the input of operational amplifier U6 via line 50.

Figure 4:
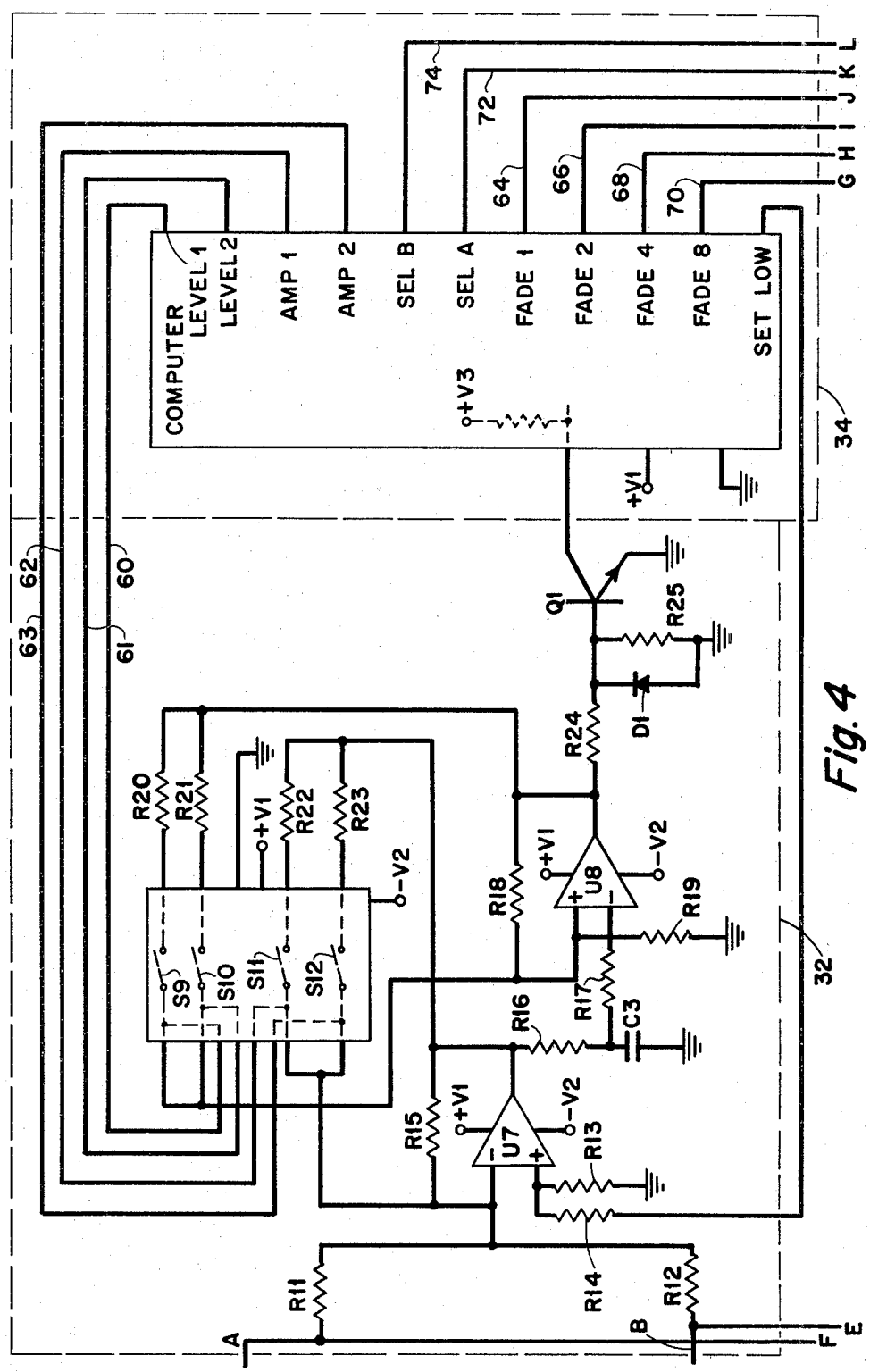
FIG. 4 is a circuit schematic of the priority detection device and micro-computer of the mixer of FIG. 2.

Referring now to FIG. 4 of the drawings, the mixer circuit comprises a pair of staged operational amplifiers U7 and U8, coupled with a switching circuit comprising switches S9, S10, S11 and S12.

The outputs from the input buffer 24 are coupled together through a pair of resistors R11 and R12, respectively, and provided as a composite input to the negative side of the operational amplifier U7. The positive side of the operational amplifier U7 is connected to ground through a resistor R13 and is also connected to the micro-computer 34 through a resistor R14. The output of the operational amplifier U7 is fed back to its negative input through a resistor R15 to set the gain of the operational amplifier.

The amplified output of the operational amplifier U7 passes through a resistor R16 and capacitor C3 to ground which forms a low pass filter. The junction between the resistor R16 and capacitor C3 then is provided as an input to the negative side of operational amplifier U8 through a resistor R17. The output of the operational amplifier U8 then is fed back to its positive input side through a resistor R18. The positive input to the operational amplifier U8 is also connected to ground through a resistor R19, the resistors R18 and R19 forming a voltage divider to set the reference voltage for the operational amplifier U8.

This reference voltage applied at the positive input side of operational amplifier U8 is also connected to one side of both switches S9 and S10.

The input to the negative side of the operational amplifier U7, is provided to one side of switches S11 and S12. Operation of the switches S9, S10, S11 and S12 is provided from the micro-computer circuit 34 via lines 60, 61, 62 and 63, respectively.

The opposite side of the switches S9 and S10 are provided with resistors R20 and R21, respectively, which are tied together and operably connected to the output of the operational amplifier U8. The opposite side of switches S11 and S12 are connected to resistors R22 and R23 which are then tied together and operably connected to the output of the operational amplifier U7.

The output of the micro-computer circuit 34 is operably connected to switches S11 and S12 of the mixer circuit via lines 63 and 62, respectively. The output of the computer circuit 34 is also connected via lines 60 and 61 to the switches S9 and S10 of the mixer circuit 32.

The output of operational amplifier U8 is connected to the base of an NPN transistor Q1 through a resistor R24. The base of the transistor Q1 is connected to ground through a resistor R25 and reverse biasing diode D1 which are in parallel. The collector of transistor Q1 is provided as an input to the micro-computer circuit 34 while the emitter thereof is grounded.

The circuit 32 therefore provides a combination mixer and Schmitt trigger. If the output voltage level from the operational amplifier U8 is above the reference voltage present at the input of the positive side of said operational amplifier, the Schmitt trigger is in a first logic state. If the voltage present at the output of operational amplifier U8 falls below the reference voltage level at the input of the positive side of the operational amplifier U8, the Schmitt trigger will change to the opposite logic state.

If the output of operational amplifier U8 is a negative voltage, it is connected to ground through resistor R24 and diode D1 reverse biasing the transistor Q1. When a positive voltage is present at the base of transistor Q1, Q1 is forward biased and its collector input to the micro-computer 34 is grounded and becomes zero volts. Thus, if the output signal at U8 is outside the threshold band set by resistor R18, the computer 34, by a series of software routines, which will be hereinafter set forth, selectively provides suitable output voltages to a plurality of lines 64, 66, 68 and 70 which are operably connected to the output latching circuit 36 which in turn causes sequential signals to be provided to the digital fader circuit 38 via lines 52, 54, 56 and 58, respectively.

The voltage levels present at the inputs of the operational amplifiers U5 and U6 are directly controlled by the digital fader circuit 38 to sequentially attenuate or fade the audio signals present at those inputs. When the signal present at the inputs of operational amplifiers U5 and U6 have been almost completely attenuated, the computer circuit 34 provides output signals along lines 72 and 74 to the output latching circuit 36 and subsequently to the audio signal selector circuit 28 via lines 40 and 42, respectively, to open switches 53 and 54 and to engage switches S1 and S2.

Figure 11:
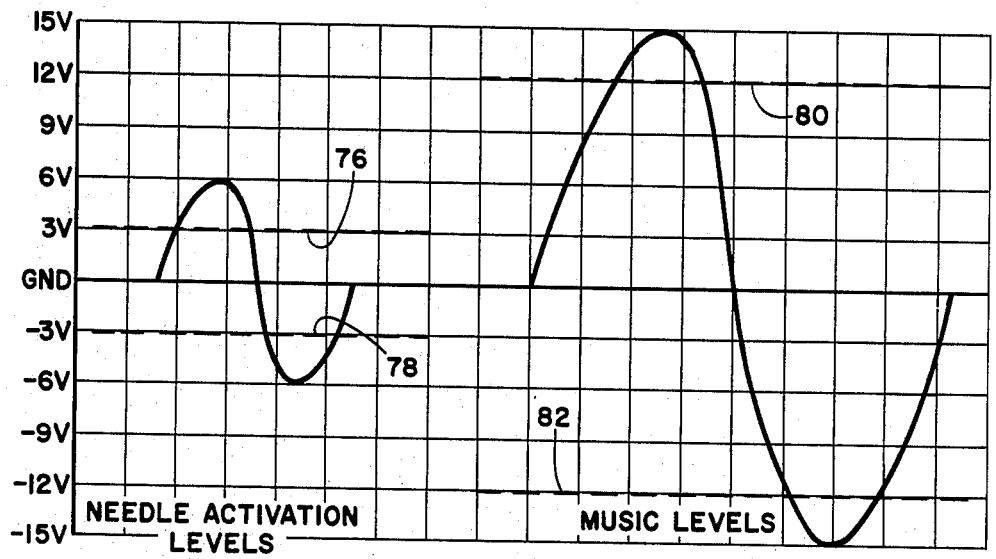
FIG. 11 depicts the adjustable threshold levels of the priority signal detector of the mixer of FIG. 2.

The reference voltage threshold at U8 is set rather narrow as shown in the first curve of FIG. 11 at plus or minus three volts by reference characters 76 and 78. Hence, if the signal is greater than plus or minus three volts at the output of operational amplifier U8, the signal is sufficient to alternately forwardly and reverse bias transistor Q1 to provide a square wave input to the micro-computer circuit 34.

Upon receipt of this signal from the phonograph 14, the computer circuit 34 sets up a delay to assure that there is a signal present. If the signal holds for the required delay time, the micro-computer then provides a switching signal via lines 60 and 61 to the mixer circuit in order to close the contacts on switches S11 and S12. This places resistors R22 and R23 into parallel with resistor R15 thereby reducing the amplification of the operational amplifier U7. This will prevent operational amplifier U7 from saturating and clipping the output wave form present at the output of operational amplifier U7. This feature is for signal processing accuracy and in no way affects the actual audio output present at the output buffer 30.

Figure 12:
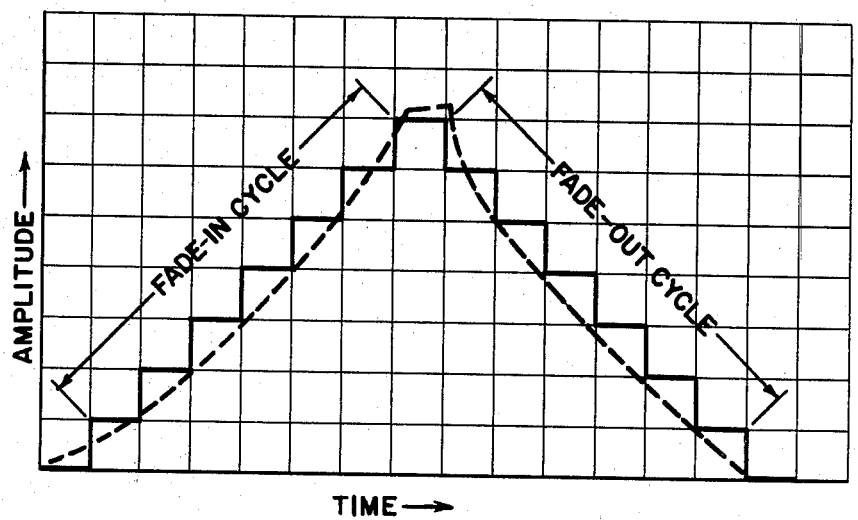
FIG. 12 is a graph depicting the fade-in and fade-out curves followed by the digital faders.

At the same time the computer circuit 34 has determined that there is still a signal at the input buffer 24, it sequentially provides signals along the lines 64 and 66, 68 and 70 to the output latches circuit 34 which in turn sequentially closes the switches of the digital fader circuit 38, switches S5 and S5a being simultaneously closed, then S6 and S6a and etcetera which provides a sequentially changing voltage at the inputs of operational amplifiers U5 and U6 thereby attenuating the signal from the tuner being provided thereat. The signal attenuation is shown by a representative graph of FIG. 12, it being recognized that four resistors in each digital fader circuit can produce up to sixteen fading steps. The dashed line of FIG. 12 represents a fade curve which is pleasing to the human ear. Naturally, the more resistors provided in the digital fader circuit, the closer the curve can be followed. When the signal from the tuner has been attenuated, simultaneous signals are provided along lines 72 and 74 from the computer to the output latching circuit 36. The signal then is processed through lines 40 and 42 which serve to close switches S1 and S2 and open switches S3 and S4 of the audio selector circuit. This, in effect, connects the stereo output from the input buffer 24 through the switches S1 and S2 to the output buffer circuit 30.

The computer then provides a signal along lines 60 and 61, which closes switches S9 and S10 of the mixer circuit 32 thereby connecting resistors R20 and R21 in parallel with resistor R18 which serves to widen the threshold band at the feedback input to the operational amplifier U8. This increased threshold is shown in the second curve of FIG. 11 with the threshold levels being set at plus or minus 12 volts and indicated by reference characters 80 and 82.

Therefore, if there is a signal above and below the threshold voltage levels 80 and 82, it would indicate that there is music on the record player and the computer sends out sequential signals along lines 70, 68, 66 and 64 which through the output latching circuit 36 serves to sequentially open the switches of the digital fader circuit 38 thereby fading the music in from the record player.

However, on the other hand, if after the threshold has been widened, there is no signal, this would indicate to the computer that although the needle is still in the groove, the musical recording has not been reached by the needle and hence there is no need to fade in the signal. In this case, the computer circuit simultaneously provides signals through lines 70, 68, 66 and 64 to simultaneously unlatch or open all of the switches of digital circuit 38 thereby allowing the full signal from the phonograph 14 to the output buffer 30.

Normally, the delay is provided after the initial sensing of a signal at the input buffer 24 is sufficiently small so that the switching can take place before the music is encountered by the needle on the record player so that the first note is not missed in bringing in the phonograph signal.

It should also be pointed out that whereas the drawings and particularly the functional block diagrams indicate that the priority signal is a phonograph, it can just as well be a tape player whereas the tape noise between musical compositions will serve to activate the system just as it will the needle in contacting the record surface.

After switching has occurred, the circuit will be tested to see if there is music present at the input buffer circuit 24. If there is, indicating that the signal level at the output of operational amplifier U8 is outside the threshold levels 80 and 82 as shown in the graph of FIG. 11, the computer will go into a half-second delay loop whereby every half second it will test to see whether or not there is music at the inputs of the input buffer 24.

Figure 8:
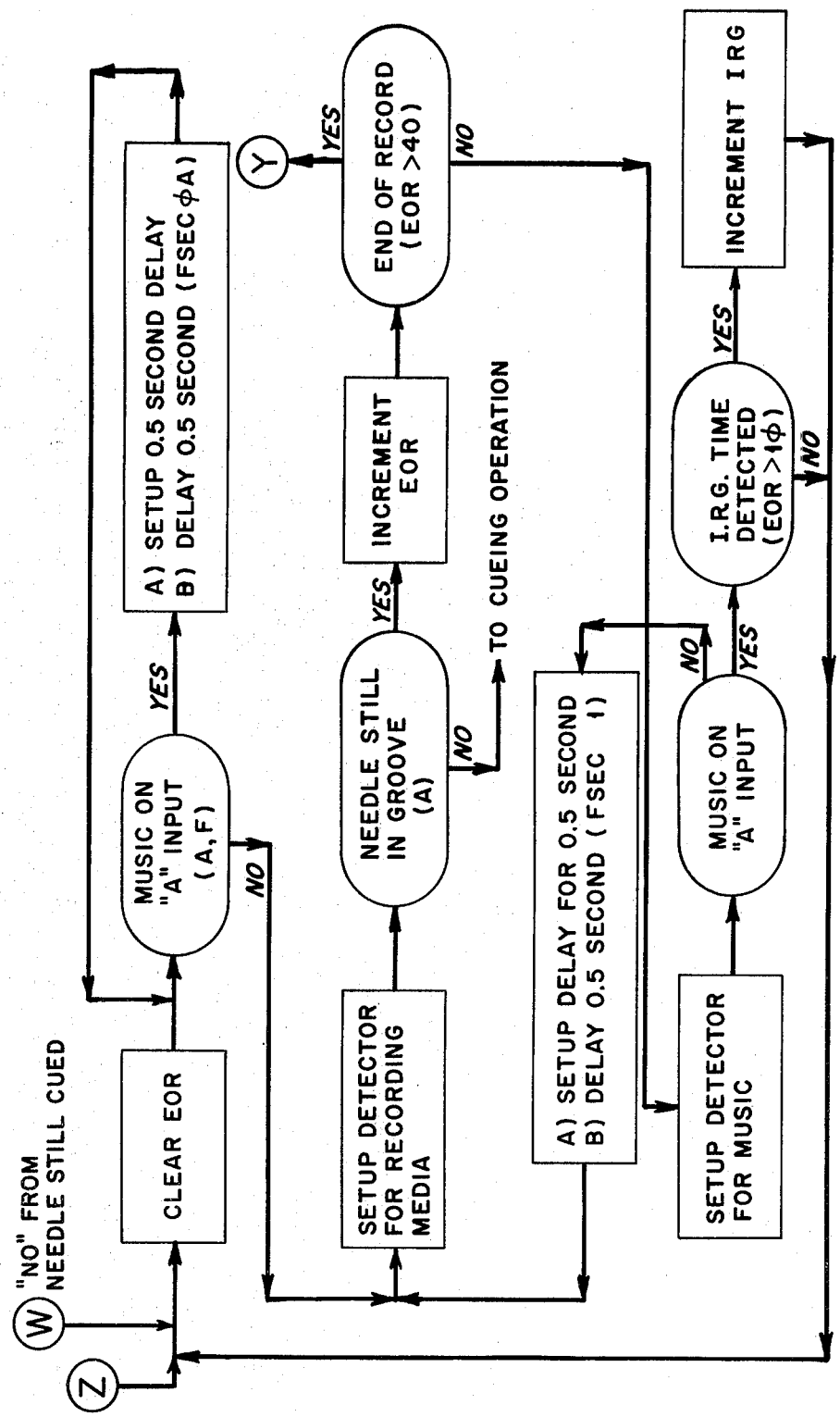
Figure 9:
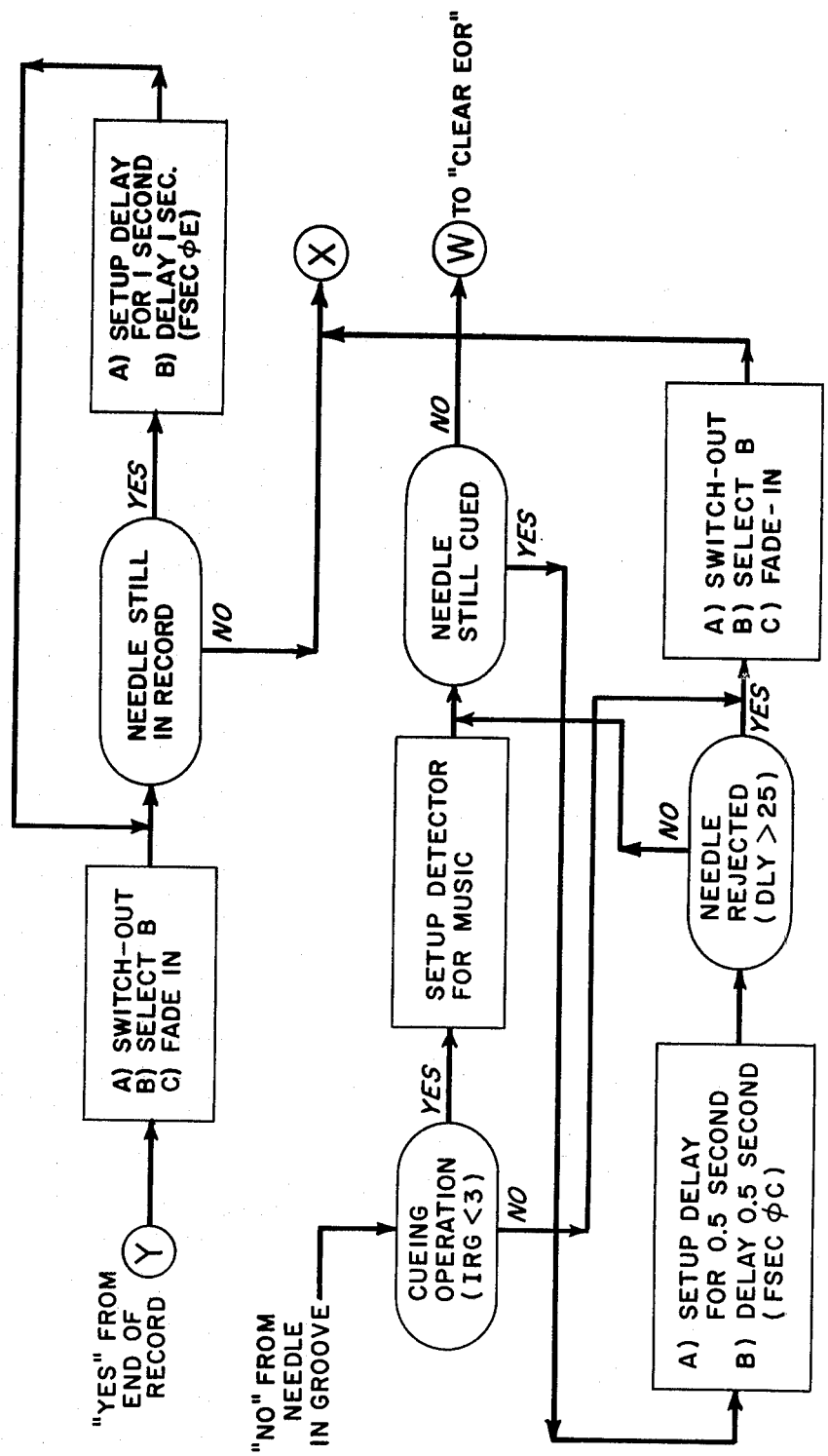
Figure 10:
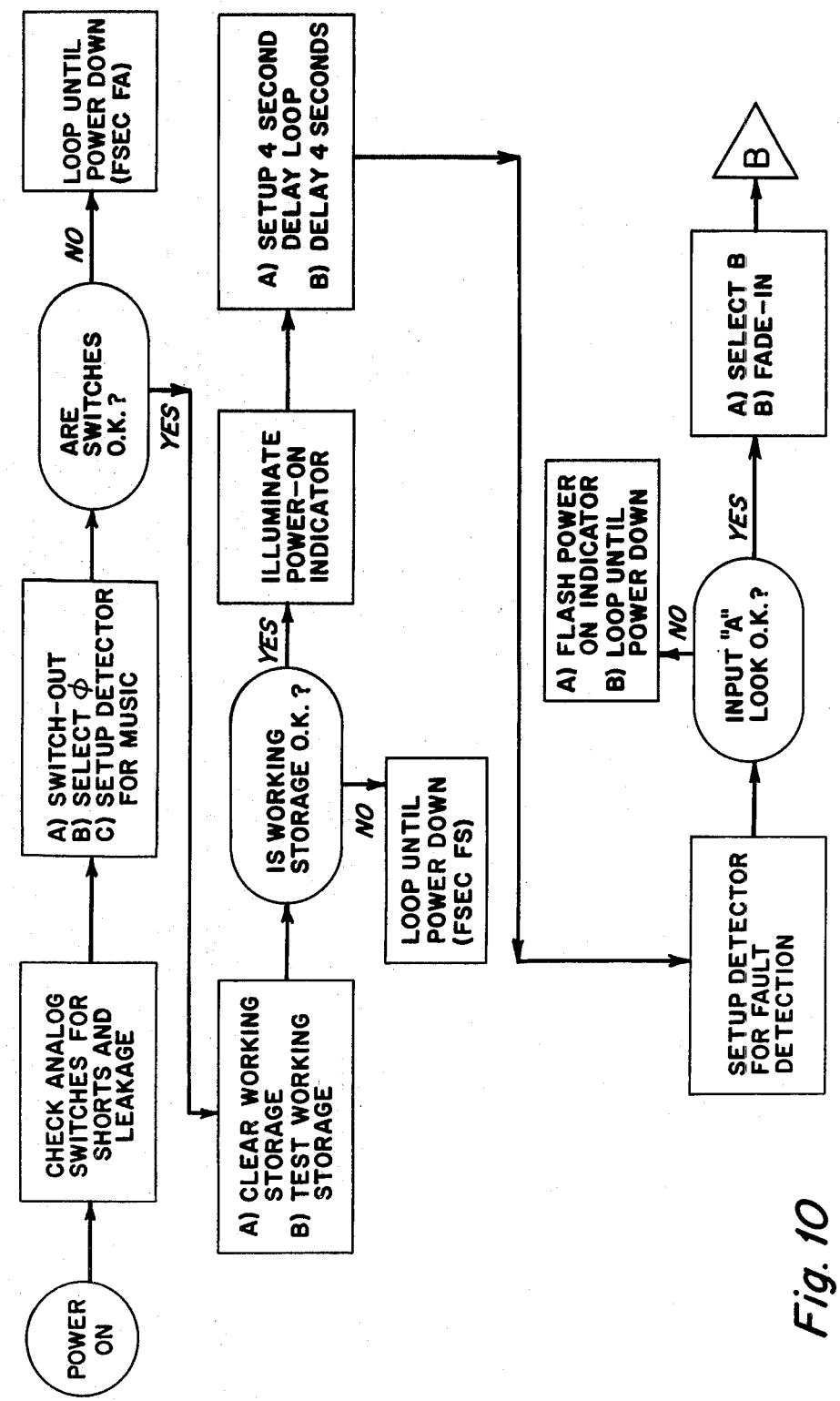

If at any time the check is made and there is no signal present with the expanded threshold limits of 80 and 82, the computer will send signals along lines 60 and 61 to open the switches S9 and S10 thereby reducing the threshold level to the levels 76 and 78 as also shown in FIG. 11. If there is a signal present at this point indicating that the needle is still in the groove, end of record (EOR) counter will be incremented and if this value is less than some arbitrary value indicated at 40 units in FIG. 8 of the drawings, the switches S9 and S10 will again be closed thereby broadening the threshold to levels 80 and 82. If there is then music at the priority input, an inner record gap time is detected and if the end of record increment is greater than a second arbitrary signal, the inner record counter is cleared. Again there is a test to determine whether there is music at the input buffer 24 and the circuit is completed. The circuit is repeated throughout the record to make sure that switching will not occur when the phonograph needle is still in place in the groove between songs on the record.

On the other hand, if there is a determination that there is no music at the input, again the threshold level is reduced by opening switches S9 and S10 and a test is made to determine whether or not the needle is in the groove. If it is not in the groove, a check is made as to whether or not the inner record gap counter is below an arbitrary level. If the inner record gap counter is greater than this arbitrary level, then switches S1 and S2 are opened and switches S3 and S4 are closed in the audio selector while simultaneously all of the switches of the digital fader circuit 38 are closed which applies the input of the tuner 14 through the audio selector to the output buffer circuit 30. The computer then sequentially opens the switches of the digital fader circuit 38 thereby fading in the signal from the tuner through the output buffer circuit 30. The computer also provides a reset signal to the mixer circuit 32 through resistor R14 to strobe the operational amplifier U7 which will provide a signal to the computer which will in turn open switches S11 and S12.

From the foregoing it is apparent that the present invention provides an audio priority selection device which may either be built into existing stereo amplifier equipment or may be packaged as a separate piece of equipment whereby the tape monitoring jacks, tuner input jacks and the like on standard equipment may be utilized without any hardware modification thereto.

It is further apparent that the present invention provides efficient and smooth transition to and from the priority signal and the alternate signal sources in a manner which is pleasing to the ear but at the same time reduces or eliminates any unnecessary signal loss during the transition.

Whereas the present invention has been described in particular relation to the drawings attached hereto, modifications apart from those shown or suggested herein may be made within the spirit and scope of the invention.

What is claimed is:

1. An automatic mixer selector device comprising:
   an audio signal selection switching circuit for selecting one of two audio input sources;

a priority source input circuit operably connected to the audio switching circuit;

an alternate source input circuit operably connected to the audio switching circuit;

an audio output circuit operably connected to the audio switching circuit for outputting the selected audio signal;

a signal attenuating means operably connected to the audio output circuit for selective fading of signals in and out;

a sensor circuit operably connected to the priority source input circuit for detecting a signal thereat; and a computer processor operably connected to the audio switching circuit, the signal attenuating means and the sensor circuit;

whereby upon detection of an audio signal present at the priority source input, said processor activates the signal attenuating means for fading out the alternate signal and actuates the signal selection switching circuit to connect the priority input to the audio output and upon loss of that signal, to switch out the priority input and fade in the alternate signal.

2. An automatic mixer selector device as set forth in claim 1 wherein each audio input source comprises multiple channels of audio signal and wherein the audio signal selection switching circuit comprises two sets of analog switches, each set having a switch for each channel of audio signal, the first set being operably connected to the priority source input circuit and the second set being operably connected to the alternate source input circuit.

3. An automatic mixer selector device as set forth in claim 1 wherein each audio input source comprises multiple channels of audio signal and wherein both input circuits comprise an input buffer circuit for each channel of audio signal, each said buffer circuit comprising a high pass filter including an in-series capacitor for blocking DC offset voltages and low frequency noise.

4. An automatic mixer selector device as set forth in claim 1 wherein each audio input source comprises multiple channels of audio signal and wherein the audio output circuit comprises an output buffer circuit for each audio channel of the selected signal, each said buffer comprising an operational amplifier, the input of which is connected to the signal attenuating means and the output of which comprises a high pass filter for eliminating noise and impedance matching.

5. An automatic mixer selector device as set forth in claim 4 wherein the signal attenuating means comprises a digital fader circuit for each audio channel of the selected signal, the output of each digital fading circuit being operably connected to the input of one of the operational amplifiers of the audio output circuit.

6. An automatic mixer selector device as set forth in claim 5 wherein each digital fader circuit comprises a plurality of parallel resistors which may be simultaneously activated to quickly attenuate the signal at the input of each output buffer circuit or may be sequentially operated to fade in or fade out said signal.

7. An automatic mixer selector device as set forth in claim 1 wherein the sensor circuit comprises a mixer amplifier for forming a composite signal of all of the channels of the priority input and a triggering circuit for converting signals outside of an amplitude threshold band into a series of square waves for inputting said square waves to the computer processor.

8. An automatic mixer selector device as set forth in claim 7 wherein the mixer amplifier comprises means for selective adjustment of gain by the computer processor.

9. An automatic mixer selector device as set forth in claim 8 wherein the mixer amplifier comprises an operational amplifier having a feedback loop through a resistor and wherein the means for selective gain adjustment comprises at least one switch and resistor in parallel with the feedback loop resistor, said switch being operatable by the computer processor.

10. An automatic mixer selector device as set forth in claim 7 wherein the triggering circuit comprises a Schmitt-type trigger and comprising means for adjusting the amplitude threshold band thereof.

11. An automatic mixer selector device as set forth in claim 10 wherein the Schmitt-type trigger comprises an operational amplifier the threshold band being established by a feedback loop having a resistor and wherein the means for adjusting the threshold band comprises at least one switch and resistor in parallel with the feedback loop resistor, said switch being operatable by the computer processor.

* * * * *